United States Patent [19]
Oshikiri

[11] Patent Number: 4,796,145
[45] Date of Patent: Jan. 3, 1989

[54] SEMICONDUCTOR MODULE

[75] Inventor: Keiichi Oshikiri, Hyogo, Japan

[73] Assignee: Mitsubishi Denki Kabushiki Kaisha, Tokyo, Japan

[21] Appl. No.: 124,337

[22] Filed: Nov. 18, 1987

Related U.S. Application Data

[63] Continuation of Ser. No. 858,746, May 2, 1986, abandoned.

[30] Foreign Application Priority Data

Jun. 3, 1985 [JP] Japan ............................ 60-118908

[51] Int. Cl.$^4$ .............................................. H02H 5/00
[52] U.S. Cl. ........................................ 361/57; 361/56; 361/87; 363/124; 363/56
[58] Field of Search ............... 361/56, 57, 87, 93, 361/100, 101; 363/56, 95, 97, 133, 124; 330/207 P, 298

[56] References Cited

U.S. PATENT DOCUMENTS

| | | | |
|---|---|---|---|
| 3,663,944 | 5/1972 | Low et al. | 363/133 |
| 4,095,128 | 6/1978 | Tanigaki | 363/134 X |
| 4,150,424 | 4/1979 | Nuechterleim | 363/134 X |
| 4,311,920 | 1/1982 | Smollinger | 363/134 X |
| 4,371,824 | 2/1983 | Gritter | 363/134 X |
| 4,453,193 | 6/1984 | Huang et al. | 361/87 X |
| 4,535,399 | 8/1985 | Szepesi | 363/134 X |
| 4,560,851 | 12/1985 | Tsukamoto et al. | 363/97 X |
| 4,626,952 | 12/1986 | Morikawa | 361/100 X |

OTHER PUBLICATIONS

Dissertations issued at the Tokai Branch Joint Great Conference of Electric Relation Society in 1982, "Influence on Waveform of Upper and Lower Arms Short Circuit Preventing Period of PWM Inverter", p. 151.
Dissertations issued at the National Conference of Electric Society in 1985, "Improvement of Output Characteristics by Compensation for Dead Time of Voltage Type Inverter", p. 611.
Dissertations issued at the National Conference of Electric Society in 1985, "Base Drive Circuit Having Function to Prevent Short-Circuit of Transistor and Inverter", p. 629.

Primary Examiner—A. D. Pellinen
Assistant Examiner—Derek S. Jennings
Attorney, Agent, or Firm—Bernard, Rothwell & Brown

[57] ABSTRACT

A semiconductor module includes two switching devices operated by the PWM control signal, current detectors for detecting currents through the respective switching devices, and bypass units operated by the corresponding opposite current detector for shunting the control signal to the respective switching devices to prevent activation thereof when the corresponding opposite switching device is conductive.

1 Claim, 2 Drawing Sheets

SEMICONDUCTOR MODULE

This is a continuation of application Ser. No. 858,746 filed May 2, 1986, now abandoned.

BACKGROUND OF THE INVENTION

1. Field of the Invention

The present invention relates to a semiconductor module and, particularly, to a semiconductor module including switching devices as components of an inverter which is used in an uninterruptable constant-voltage constant-frequency (CVCF) power unit.

2. Description of the Prior Art

FIG. 1 is a block diagram showing the conventional semiconductor module and its associated switching control circuit taking charge of one phase of an inverter. In the figure, a PWM control circuit 1 has its output connected to a short-circuit prevention circuit 2, which provides outputs to drive circuits 3a and 3b. The drive circuits 3a and 3b supply their outputs to a semiconductor module 4 which incorporates two serial-connected self-turn-off switching devices, such as transistors and GTOs, Q1 and Q2.

FIG. 2 is a timing chart showing the input/output signals among the component blocks shown in FIG. 1. The chart includes the output signal $S1_A$ of the PWM control circuit 1, the drive signal $S1_B$ provided by the positive drive circuit 3a for the positive switching device Q1, the drive signal $S1_C$ provided by the negative drive circuit 3b for the negative switching device Q2, and the output signal $S1_D$ produced by the semiconductor module 4.

Next, the operation of the above-mentioned prior art system will be described. The PWM control circuit 1 determines the timing of activating or deactivating the switching devices Q1 and Q2 which constitute a phase arm of the inverter, and produces the output signal $S1_A$. A high output signal $S1_A$ operates on the drive circuit 3a to produce the drive signal $S1_B$ by which the positive switching device Q1 turns on, while the negative switching device Q2 does not receive its drive signal $S1_C$ from the drive circuit 3b and stays in the off state. Conversely, a low output signal $S1_A$ does not provide the drive signal $S1_A$ for the positive switching device Q1, causing it to stay in the off state, while the negative switching device Q2 receives the drive signal $S1_C$ from the drive circuit 3b and turns on.

In the transition of the output signal $S1_A$ from high to low, or from low to high, namely when one switching device changes the state from on to off and another switching device from off to on, the main current in the turning-off switching device Q1 or Q2 goes off with a time lag of a carrier storage time plus a turn-off time with respect to the turn-off command by the drive signal $S1_B$ or $S1_C$, resulting in an improper operating mode where both switching devices Q1 and Q2 are in the on state simultaneously (this state is termed here "vertical short-circuit").

In order to prevent the occurrence of vertical short-circuit, a short-circuit preventing circuit 2 is provided, and it causes the turning-on drive signal $S1_B$ or $S1_C$ to lag so that both switching devices Q1 and Q2 are given the off-command for a certain time length 't'. However, when the pulse width is narrow, as in the high-frequency PWM control, a time lag in the turn-on command causes the semiconductor module 4 to produce the output $S1_D$ which is different in pulse width from the PWM control signal $S1_A$, and a theoretical output waveform which is free of specific harmonics cannot be accomplished.

SUMMARY OF THE INVENTION

A main object of the present invention is to provide a semiconductor module which effectively overcomes the foregoing prior art deficiency.

Another object of the invention is to provide a semiconductor module which minimizes the vertical short-circuit interrupting period for serial-connected switching devices and is capable of switching at a nearest timing to the PWM control signal.

Other objects and advantages of the present invention will become more apparent from the following description of the preferred embodiments taken in conjunction with the accompanying drawings.

DESCRIPTION OF THE PREFERRED EMBODIMENTS

Figure 1:
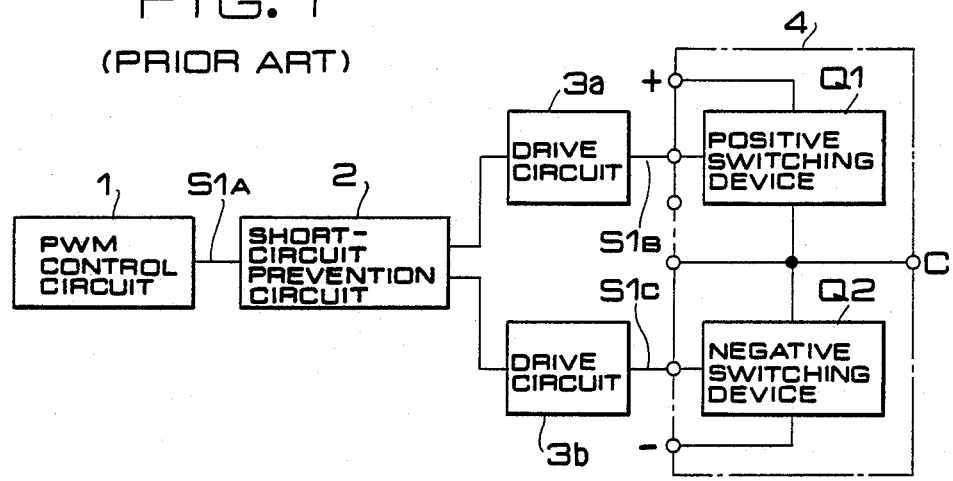
FIG. 1 is a block diagram showing the conventional semiconductor module and its associated switching control circuit used for a phase arm of an inverter.
Figure 2:
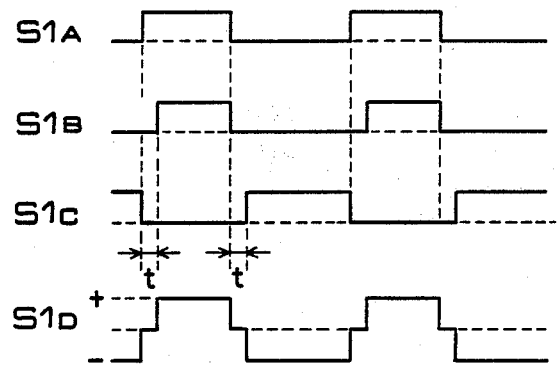
FIG. 2 is a timing chart showing the input/output signals among the component blocks shown in FIG. 1.

An embodiment of the present invention will now be described with reference to FIG. 3, in which counterparts of FIG. 1 are referred to by the common symbols. Reference numbers 5a and 5b denote logical AND gates and reference number 6 denotes a semiconductor module. The semiconductor module 6 includes transistors Q3 and Q4 functioning as serial-connected switching devices and current sensors Q5 and Q6 for detecting the presence or absence of the emitter current of the transistors Q3 and Q4, with the outputs of the sensors Q5 and Q6 being connected to the inverting input of the AND gates 5a and 5b, respectively. A diode Q9 is connected in parallel to the switching device Q3 and current detector Q5 and a diode Q10 is connected in parallel to the switching device Q4 and current detector Q6 so as to bypass the switching devices and prevent reverse currents therethrough when the potential at the emitter side of the switching device becomes positive with respect to the potential at the collector side of the switching device.

Figure 3:
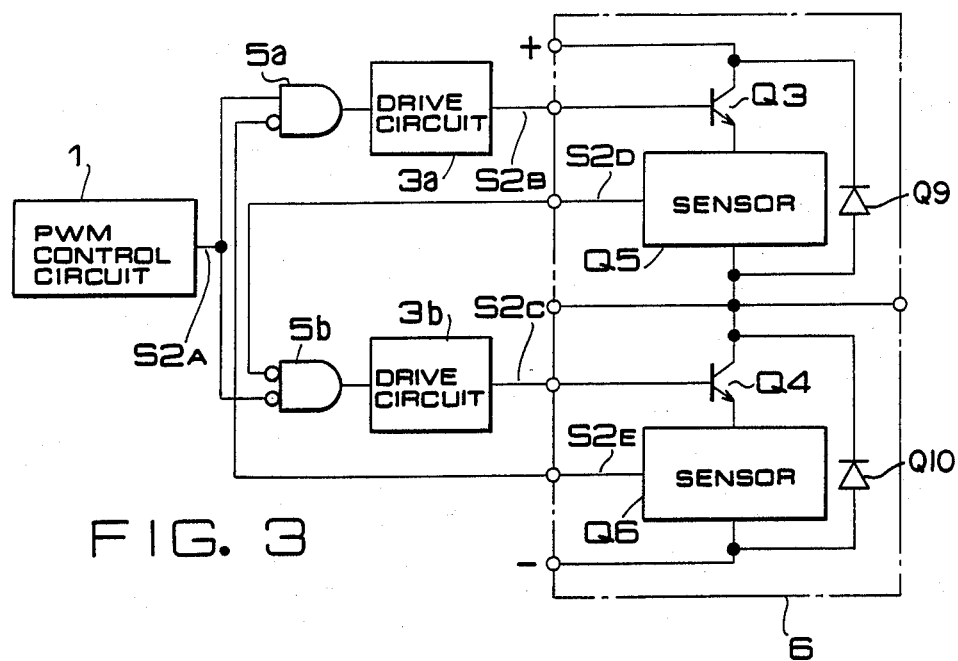
FIG. 3 is a block diagram showing an embodiment of the inventive semiconductor module and its associated switching control circuit used for a phase arm of an inverter.
Figure 4:
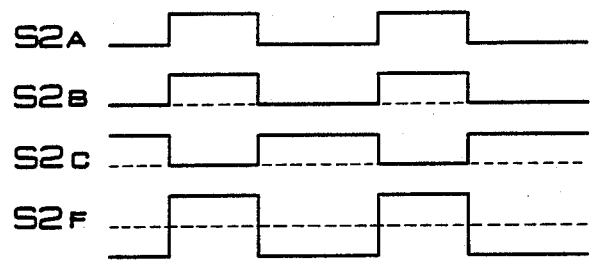
FIG. 4 is a timing chart showing the input/output signals among the component blocks shown in FIG. 3.

The timing chart shown in FIG. 4 includes the output signal $S2_A$ of the PWM control circuit 1, the base drive signal $S2_B$ produced by the positive drive circuit 3a for controlling the operation of the positive switching device Q3, the base drive signal $S2_C$ produced by the negative drive circuit 3b for controlling the operation of the negative switching device Q4, and the output signal $S2_F$ of the semiconductor module 6. In FIG. 3, the current sensor Q5 detects the emitter current of the switching device Q3 and provides a logical output signal $S2_D$, while another current sensor Q6 detects the emitter current of the switching device Q4 and provides a logical output signal $S2_E$. The sensor output signals $S2_D$ and $S2_E$ have a variable transitional timing depending on the power-factor of the load circuit, and therefore are not shown in the timing chart of FIG. 4.

The operation of the foregoing circuit arrangement is as follows.

The PWM control circuit 1 determines the timing of switching for the switching transistors Q3 and Q4, by providing a high output $S2_A$ to make a drive signal $S2_B$ for turning on the transistor Q3 and providing a low output $S2_A$ to make a drive signal $S2_C$ for turning on the transistor Q4, as in the conventional system. The current sensors Q5 and Q6 detect the presence or absence of the emitter current of the transistors Q3 and Q4, and produce a high detection signal $S2_D$ or $S2_E$ or a low detection signal $S2_D$ or $S2_E$ in correspondence to the presence or absence of each emitter current.

When the output signal $S2_A$ of the PWM control circuit 1 makes a transition from low to high in the presence of the emitter current of the transistor Q4, the detection signal $S2_E$ goes high, causing the AND gate 5a to produce a low output signal $S2_B$, and the transistor Q3 is not turned on. At the subsequent moment when the emitter current of the transistor Q4 has gone off, the detection signal $S2_E$ becomes low, causing the AND gate 5a to produce a high output signal, and the transistor Q3 is turned on by the drive signal from the drive circuit 3a.

Conversely, when the output signal $S2_A$ of the PWM control circuit 1 makes a transition from high to low in the presence of the emitter current of the transistor Q3, the drive circuit 3b produces a low drive signal $S2_C$, retaining the transistor Q4 in the off state. The drive signal $S2_C$ becomes high the moment Q3 emitter current has gone off, and the transistor Q4 is turned on. Accordingly, no time lag arises in the turn-on and turn-off operations of both switching devices in the moment of transition of one switching device from on to off and another switching device from off to on.

Figure 5:
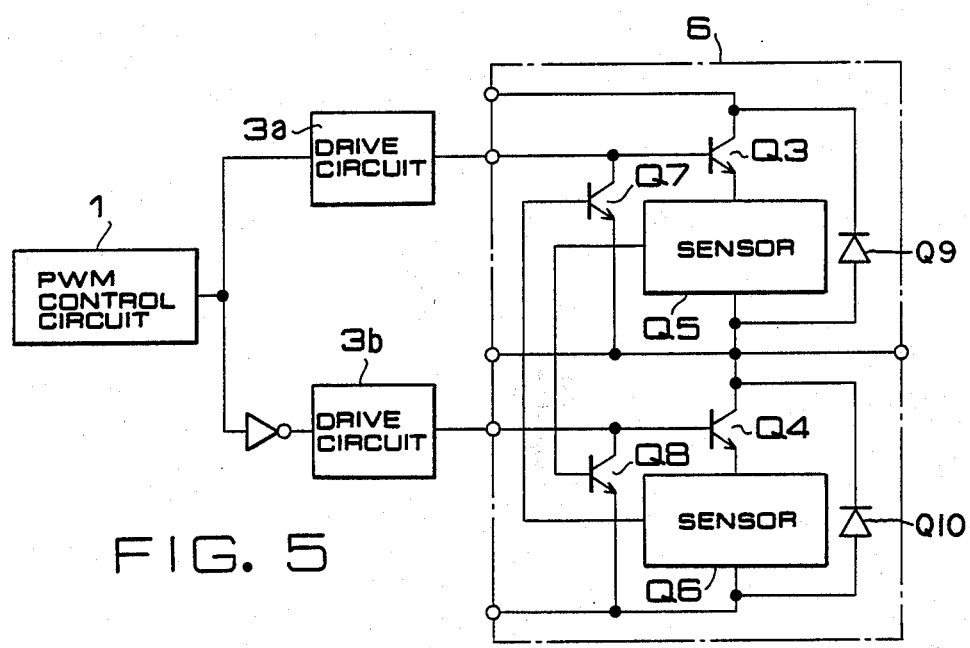
FIG. 5 is a block diagram showing another embodiment of this invention.

FIG. 5 shows another embodiment of this invention, in which the semiconductor module 6 is provided therein with base drive signal bypass circuits or transistors Q7 and Q8 which are controlled internally to become conductive so that the switching device Q3 or Q4 is forced to cut off, instead of using the external interlock circuit.

Although in the foregoing embodiments of FIGS. 3 and 5 the semiconductor module 6 is a transistor module, the switching devices may be other self-turn-off devices such as GTOs and MOSFETs to accomplish the same effect as described above.

The present invention is intended to prevent vertical short-circuitting of two switching devices in a semiconductor module by provision of current sensors which detect the presence or absence of the main current of the switching devices. The simple inventive circuit arrangement surely prevents the improper mode of operation in which two switching devices are in the on state simultaneously. In consequence, the switching devices produce the pulse width with much fidelity to the command waveform, whereby the inverter constituted by the semiconductor modules can have the enhanced performance.

What is claimed is:
1. A semiconductor module comprising:
   (a) two switching devices connected in series to each other and activated in response to respective driving signals;
   (b) two current detectors for detecting currents conducted by the respective switching devices;
   (c) short-circuit preventing means for preventing short-circuiting of said switching devices in accordance with non-delayed output signals produced by said current detectors, said short-circuit preventing means including two bypass circuits operated by the corresponding opposite current detector for shunting the drive signals to the respective switching devices only during the output signal of the corresponding opposite current detector so as to prevent activation of the respective switching devices when the corresponding opposite switch device is conductive; and
   (d) diodes each connected in parallel to each of said switching devices, said current detectors each inserted between the respective switching device and an anode electrode of the corresponding diode.

* * * * *